US009145609B2

(12) United States Patent
Choi et al.

(10) Patent No.: US 9,145,609 B2
(45) Date of Patent: Sep. 29, 2015

(54) LATERAL FLOW ATOMIC LAYER DEPOSITION DEVICE

(75) Inventors: Young-Seok Choi, Daejeon (KR); Dae-Youn Kim, Daejeon (KR); Seung Woo Choi, Cheonan (KR); Yong Min Yoo, Seoul (KR); Jung Soo Kim, Cheonan (KR)

(73) Assignee: ASM GENITECH KOREA LTD., Cheonan-Si (KR)

( * ) Notice: Subject to any disclaimer, the term of this patent is extended or adjusted under 35 U.S.C. 154(b) by 294 days.

(21) Appl. No.: 13/439,178

(22) Filed: Apr. 4, 2012

(65) Prior Publication Data

US 2012/0272900 A1    Nov. 1, 2012

(30) Foreign Application Priority Data

Apr. 29, 2011    (KR) .................. 10-2011-0040716

(51) Int. Cl.
*C23C 16/455*    (2006.01)

(52) U.S. Cl.
CPC ..... *C23C 16/45591* (2013.01); *C23C 16/45502* (2013.01); *C23C 16/45525* (2013.01); *C23C 16/45563* (2013.01); *C23C 16/45587* (2013.01); *C23C 16/45512* (2013.01)

(58) Field of Classification Search
CPC ............ C23C 16/455; C23C 16/45502; C23C 16/45512; C23C 16/45525; C23C 16/45563; C23C 16/45587; C23C 16/45591
See application file for complete search history.

(56) References Cited

U.S. PATENT DOCUMENTS

| | | | | |
|---|---|---|---|---|
| 6,539,891 | B1 * | 4/2003 | Lee et al. | 118/723 E |
| 6,902,620 | B1 * | 6/2005 | Omstead et al. | 117/107 |
| 7,976,898 | B2 * | 7/2011 | Hong et al. | 427/255.7 |
| 8,282,735 | B2 * | 10/2012 | Choi et al. | 118/715 |
| 8,333,839 | B2 * | 12/2012 | Oh | 118/715 |
| 8,470,718 | B2 * | 6/2013 | Lee | 438/763 |
| 8,721,835 | B2 * | 5/2014 | Kools | 156/345.34 |
| 2002/0052109 | A1 * | 5/2002 | Zhang et al. | 438/687 |
| 2003/0124820 | A1 * | 7/2003 | Johnsgard et al. | 438/482 |
| 2003/0150560 | A1 * | 8/2003 | Kinnard et al. | 156/345.33 |
| 2005/0241176 | A1 * | 11/2005 | Shero et al. | 34/443 |
| 2006/0249077 | A1 * | 11/2006 | Kim et al. | 118/723 MP |
| 2007/0281084 | A1 * | 12/2007 | Hirosawa et al. | 427/248.1 |
| 2008/0056975 | A1 * | 3/2008 | Won et al. | 423/263 |
| 2008/0110399 | A1 * | 5/2008 | Park et al. | 118/715 |
| 2008/0241384 | A1 * | 10/2008 | Jeong et al. | 427/255.29 |
| 2009/0165715 | A1 * | 7/2009 | Oh | 118/723 R |
| 2009/0214798 | A1 * | 8/2009 | Yousif et al. | 427/534 |
| 2010/0116207 | A1 * | 5/2010 | Givens et al. | 118/715 |
| 2010/0307415 | A1 * | 12/2010 | Shero et al. | 118/715 |
| 2011/0020545 | A1 * | 1/2011 | Kim et al. | 427/248.1 |
| 2012/0272900 | A1 * | 11/2012 | Choi et al. | 118/715 |

FOREIGN PATENT DOCUMENTS

KR    10-0624030    1/2001

* cited by examiner

*Primary Examiner* — Jeffrie R Lund
(74) *Attorney, Agent, or Firm* — Lex IP Meister, PLLC

(57) ABSTRACT

A lateral flow atomic layer deposition device according to an exemplary embodiment of the present invention eliminates a gas flow control plate in a conventional lateral flow atomic layer deposition device and controls shapes of a gas input part and a gas output part in a reactor cover to make a gas flow path to a center of a substrate shorter than a gas flow path to an edge of the substrate and thereby increase the amount of gas per unit area flowing to the center of the substrate. Therefore, film thickness in the center of the substrate in the lateral flow reactor increases.

9 Claims, 8 Drawing Sheets

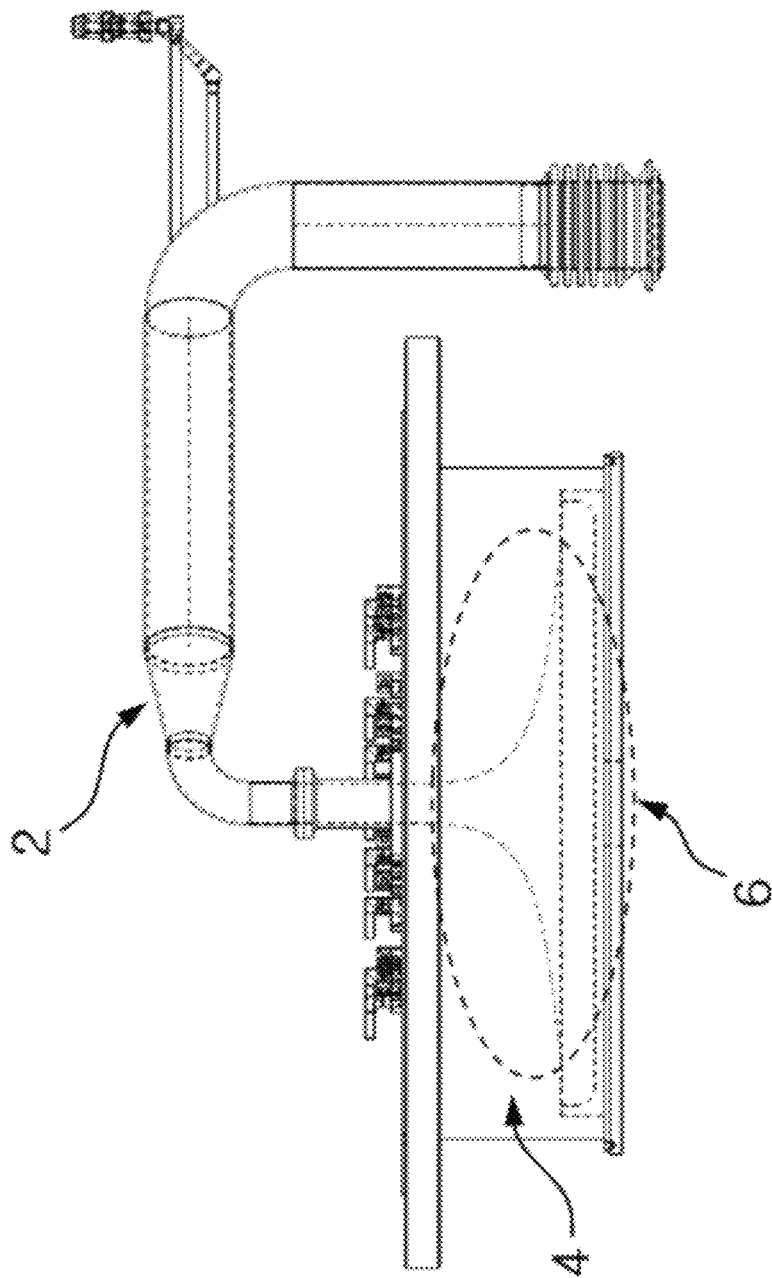

LATERAL FLOW ATOMIC LAYER DEPOSITION DEVICE

CROSS-REFERENCE TO RELATED APPLICATION

This application claims priority to and the benefit of Korean Patent Application No. 10-2011-0040716 filed in the Korean Intellectual Property Office on Apr. 29, 2011, the entire contents of which are incorporated herein by reference.

BACKGROUND OF THE INVENTION (a) Field of the Invention

The present invention relates to a lateral flow atomic layer deposition device.

(b) Description of the Related Art

Efforts to improve an apparatus or process for forming a high quality thin film on a substrate in the field of semiconductor devices have been made. Atomic layer deposition (ALD) has recently been proposed, in which two or more reaction materials are temporally isolated and sequentially fed onto a substrate, and a thin film is grown thereon through a surface reaction, followed by repeating such a process so as to form a thin film with a desired thickness. As the film is formed through a surface reaction, a thin film with a uniform thickness is formed over the entire surface of the substrate irrespective of protrusions and depressions thereof, and impurities are prevented from intruding into the thin film, thereby ensuring excellent film characteristics.

Various structures of reactors have been developed so as to realize the atomic layer deposition (ALD) process that is widely applied to semiconductor processes. Regarding the ALD process, the basic gas supply order of source gas supply/purge and reaction gas supply/purge is repeated until a desired thickness of a film is deposited. To realize excellent characteristics of the ALD process, there must be no inter-reaction between reaction gases during a process, differing from the conventional deposition method such as CVD, and to increase productivity for commercialization, switching time between the reaction gases must be swift. Showerhead-structured reactors have already been developed, but such structures have a limit in reducing the switching time between the reaction gases because of a problem such as a complex gas passage in the showerhead, and particles can be generated in the showerhead because of a reaction between remaining reaction gases therein, leading to low yield of semiconductor chips, so the above-noted structure has limits in commercialization.

To solve the problem of the atomic layer deposition device with the showerhead structure, a lateral flow reactor was developed. The lateral flow reactor has an optimized small reaction space for an atomic layer deposition process. The lateral flow reactor is well-described in the Korea Patent 624030 by ASM Genitech Korea Ltd. and U.S. Pat. No. 6,539,891, its family patent. The lateral flow reactor can have a gas flow control plate installed to supply at least two kinds of gases in the reaction space inside the reactor through a top part of the reactor.

The lateral flow atomic layer deposition device will now be described with reference to FIG. 1A and FIG. 1B.

FIG. 1A shows a cross-sectional view of a conventional lateral flow atomic layer deposition device, and FIG. 1B shows a gas flow control plate of a lateral flow atomic layer deposition device shown in FIG. 1A.

Referring to FIG. 1A, the atomic layer deposition device includes a substrate supporting plate 160 for supporting a substrate 150, a reactor cover 100 formed on the substrate supporting plate 160 and defining a reaction chamber while contacting the substrate supporting plate 160, a gas inlet 110 and a gas outlet 120 connected to the reactor cover 100 to supply gas to the reactor and exhaust gas from the reactor, respectively, a substrate supporting plate heater 170 for heating the substrate supporting plate 160, and a cover heater 130. A gas flow control plate 140 for controlling gas flow is provided in the reactor cover 100 to flow the gas in a lateral direction over the substrate and keep the gas flow close to a laminar flow in the reaction chamber. The reaction gas is supplied to the reactor through the gas inlet 110 on the top side of the reactor, it horizontally flows over the substrate 150, and it is then discharged to the outlet 120 on the top side of the reactor.

Referring to FIG. 1B, the gas flow control plate 140 includes gas inflow/outflow channels 141 and 142. The source gas and the reaction gas supplied through the gas inlet 110 pass through the gas inflow channel 141, spread fanwise to flow over the substrate 150, and gather while passing through the gas outflow channel 142, and it is then discharged through the outlet 120.

A gas flow distance in the center of the gas inlet channel 141 is greater than that on the edge thereof, and resultantly, the amount of gas supplied to the center of the substrate is less than that of gas supplied to the edge region of the substrate per unit time, leading to a thinner film thickness at the center of the substrate than at the edge of the substrate.

As described, the gases in the conventional lateral flow reactor are supplied to one side of the reaction space to flow in the lateral direction over the substrate, and are then discharged to the opposite side. However, in the above-described reactor, the gases flow to the edge of the substrate and a relatively smaller amount of gases are supplied to the center of the substrate to thus reduce the film thickness at the center of the substrate.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a lateral flow atomic layer deposition device in which more gases are induced to the center of a substrate.

An exemplary embodiment of the present invention provides a lateral flow atomic layer deposition device in which gases flow horizontally over the substrate in a reaction space formed between the substrate and an opposite side facing the substrate, including: a reactor cover for defining a reaction space together with a substrate supporting plate; a gas inlet unit disposed on one side of the reaction space, and having an internal shape that becomes wider when approaching the substrate; a gas outlet unit disposed on another side of the reaction space facing the one side of the reaction space, and having an internal shape that becomes wider when approaching the substrate; a gas inlet connected to the gas inlet unit; and a gas outlet connected to the gas outlet unit.

The gas inlet unit and the gas outlet unit are formed in the reactor cover.

The reactor cover includes a top wall, a bottom wall, and a side wall, the side wall surrounds at least a part of the side of the top wall, and the gas inlet unit and the gas outlet unit are formed to face each other on the top wall.

The gas inlet includes a plurality of inlets.

The gas inlet is disposed to face the substrate, and the gas inlet unit has an internal shape that becomes wider when approaching the substrate from the gas inlet.

Regarding a gas flow path across the substrate from the gas inlet through the gas inlet unit, the path through a center of the substrate is shorter than the path via an edge of the substrate.

According to the embodiment of the present invention, the gas flow control plate is eliminated and shapes of a gas inlet unit and a gas outlet unit of the reactor cover are controlled such that a gas flow path through the center of the substrate can be shorter than a gas flow path via the edge of the substrate, thereby increasing the amount of gas supplied to the center of the substrate per unit area. Therefore, a reduction of the film thickness at the center of the substrate occurring in the conventional lateral flow reactor can be prevented. Also, the shape of the gas inlet unit is changeable in various ways to supply gas in a desired manner.

In addition, in the conventional lateral flow reactor with a gas flow control plate described in FIG. 1, the source gas or the reaction gas collides many times with itself in the complex internal gas flow path while reaching the reaction space, leading to recombination or decomposition between gases and lack of gases, so additional gases have to be supplied to offset the amount of gas that was lost while reaching the reaction space and to deposit a thin film with a desired thickness. But in the lateral flow atomic layer deposition device according to the exemplary embodiment of the present invention, the gas supplying system is simplified to reduce recombination or decomposition between gases and to reduce gas switching time such that the entire process time can be further reduced. In addition, the structure of the reactor is simplified compared to the existing lateral flow reactor so its maintenance becomes easier.

BRIEF DESCRIPTION OF THE DRAWINGS

FIG. 2C shows a perspective view of a gas outlet unit of an atomic layer deposition device according to an exemplary embodiment of the present invention.

DETAILED DESCRIPTION OF THE EMBODIMENTS

Advantages and features of the present invention and methods to achieve them will be elucidated from exemplary embodiments described below in detail with reference to the accompanying drawings. However, the present invention is not limited to exemplary embodiment disclosed herein but may be implemented in various forms. The exemplary embodiments are provided by way of example only so that a person of ordinary skill in the art can fully understand the disclosures of the present invention and the scope of the present invention. Therefore, the present invention will be defined only by the scope of the appended claims.

A lateral flow atomic layer deposition device according to an exemplary embodiment of the present invention will now be described with reference to accompanying drawings.

Figure 1A:
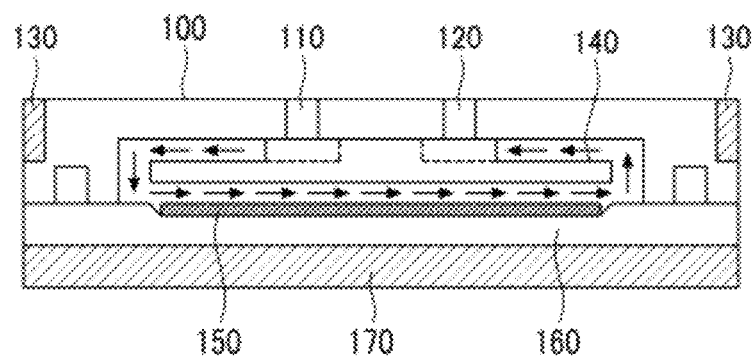
FIG. 1A shows a cross-sectional view of a conventional lateral flow atomic layer deposition device.
Figure 1B:
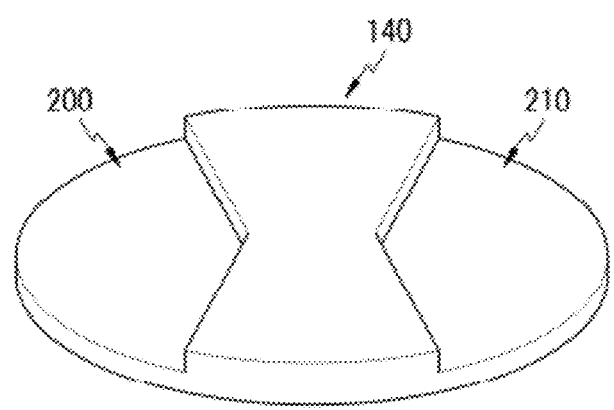
FIG. 1B shows a gas flow control plate of a lateral flow atomic layer deposition device shown in FIG. 1A.
Figure 2A:
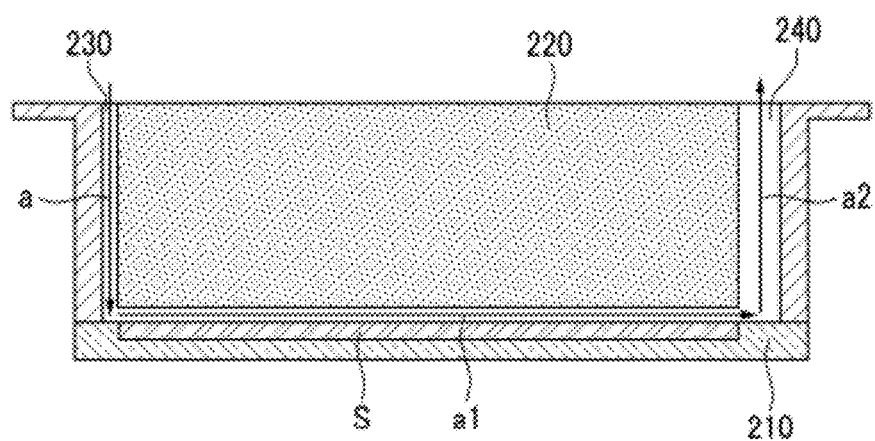
FIG. 2A shows a cross-sectional view of an atomic layer deposition device according to an exemplary embodiment of the present invention.
Figure 2B:
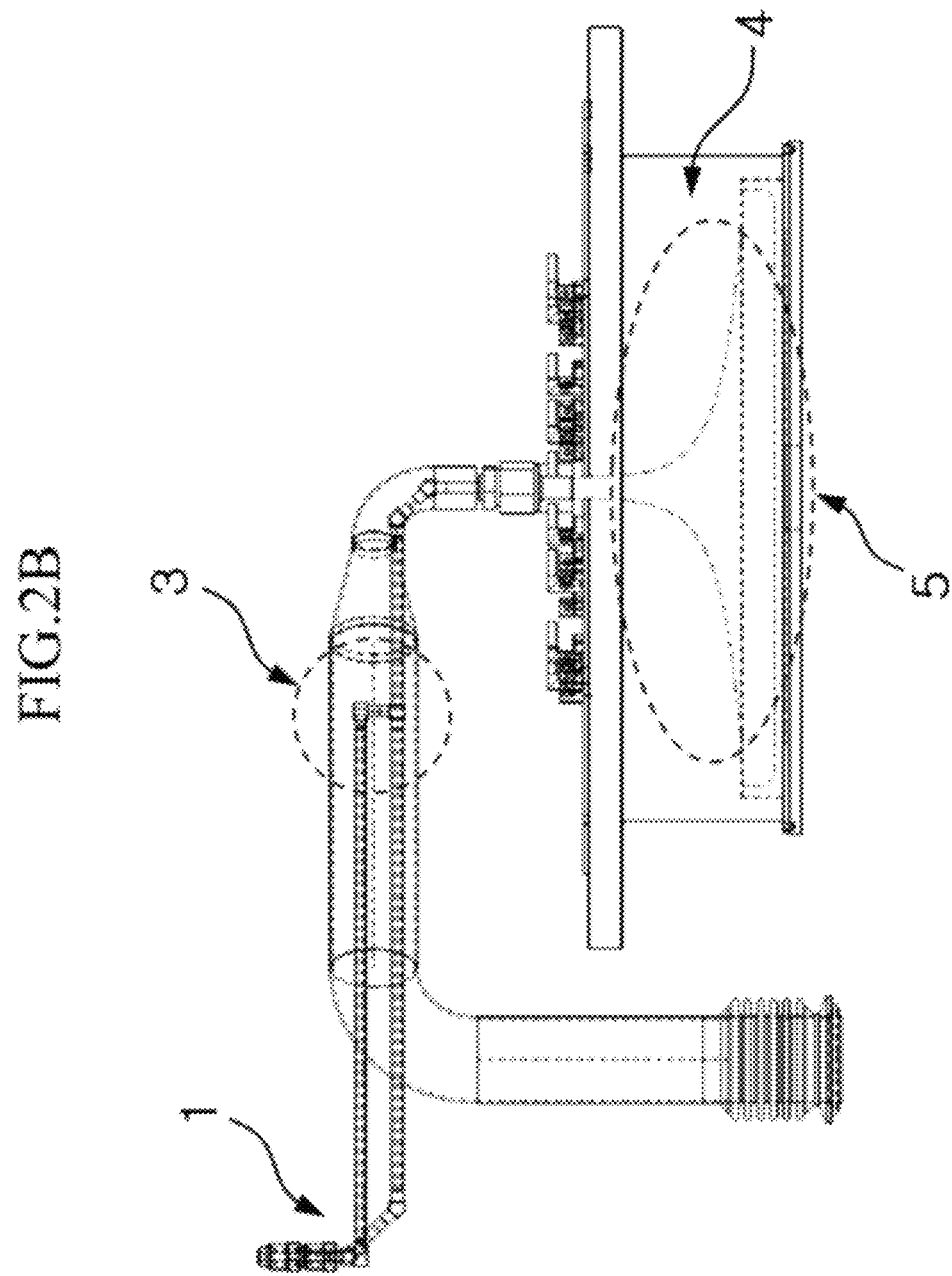
FIG. 2B shows a perspective view of a gas inlet unit of an atomic layer deposition device according to an exemplary embodiment of the present invention.

A lateral flow atomic layer deposition device according to an exemplary embodiment of the present invention will now be described with reference to FIG. 2A to FIG. 2C. FIG. 2A shows a cross-sectional view of an atomic layer deposition device according to an exemplary embodiment of the present invention, FIG. 2B shows a perspective view of a gas inlet unit of an atomic layer deposition device according to an exemplary embodiment of the present invention, and FIG. 2C shows a perspective view of a gas outlet unit of an atomic layer deposition device according to an exemplary embodiment of the present invention.

Referring to FIG. 2A, the lateral flow atomic layer deposition device includes a substrate supporting plate 210 for supporting a substrate (S) on which a process will be performed, a reactor cover 220 formed on the substrate supporting plate 210 and defining a reaction chamber while contacting the substrate supporting plate 210, a gas inlet unit 230 integrally formed in the reactor cover 220 and including an inlet port for defining an inlet path of process gas, and a gas outlet unit 240 including an outlet port for defining an outlet path of the process gas.

The gas inlet unit 230 and the gas outlet unit 240 of the lateral flow atomic layer deposition device are formed in the reactor cover 220 as one body, the process gas input into the gas inlet unit 230 flows along a first path (a) that is formed on one side of the reactor, passes through a second path a1 on the substrate (S), and is used for the process, and the remaining process gas flows along a third path a2 and is then discharged to the outside through the gas outlet unit 240. As described, the lateral flow atomic layer deposition device supplies gas to one side of the reactor cover 220 without the conventional gas flow control plate and discharges the gas through another side on the facing side such that a flow path of the gas is simplified. Therefore, recombination and decomposition of gases during gas supply on the gas path can be reduced and the switching time of the gases is reduced, thereby reducing the process time.

The gas inlet unit 230 and the gas outlet unit 240 of a lateral flow atomic layer deposition device according to an exemplary embodiment of the present invention will now be described with reference to FIG. 2B and FIG. 2C.

Referring to FIG. 2B, the gas inlet unit 230 includes a plurality of gas supply lines 1, a gas mixer 3, and an inlet port 5. Referring to FIG. 2C, the gas outlet unit 240 includes a gas outlet line 2 and an outlet port 6 connected to an exhaust pump. The gas inlet unit 230 and the gas outlet unit 240 are formed with the reactor cover 220 as one body.

The source gas, reaction gas, purge gas, or a mixed gas thereof is supplied through the gas supply lines 1 of the gas inlet unit 230. A source supply line and a reaction gas supply line are merged at the gas mixer 3. When source gas is supplied to the reactor through the gas mixer 3, purge gas is supplied to the gas mixer 3 through the reaction gas supply line to prevent the source gas from flowing backward to the reaction gas supply line. A reaction gas is supplied to the reactor through the gas mixer 3, and a purge gas is supplied to the gas mixer 3 to prevent the reaction gas from flowing backward to the source gas supply line. According to another exemplary embodiment of the present invention, a 2-way valve can be used as a gas mixer to prevent gas from flowing backward to other gas line, or another device to prevent backward flow can be used.

The gas having passed the gas mixer 3 is supplied to the reactor through the inlet port 5 and flows to the substrate, and the inlet port 5 becomes wider as it approaches the bottom of the reaction space where the substrate is loaded. Therefore, the gas path from the gas inlet unit 230 to the center of the substrate (S) becomes shorter than that from the gas inlet unit 230 to the edge of the substrate (S). Also, the inside of the inlet port 5 has a curved shape so the gas smoothly flows at the curve. That is, the inlet port 5 has an internally curved shape which becomes gradually wider from the inlet unit. According to the lateral flow atomic layer deposition device with above-described configuration, the gas flow path to the central portion of the substrate is shorter than the gas flow path to the edge of the substrate such that the amount of gas per unit area supplied to the center of the substrate is increased. Hence, a film thickness reduction at the center of the substrate in the conventional lateral flow reactor can be prevented.

The gas supplied through the gas inlet unit 230 flows over the substrate (S) and is used for the film deposition, and the remaining gas flows to the outlet port 6 and is discharged to the outside through the gas outlet line 2. Like the inlet port 5, the outlet port 6 has an internally curved shape which becomes gradually narrower until reaching the gas outlet line 2 from the inside of the reactor. By the above-noted configuration, the gas supplied to the center of the substrate (S) can be easily discharged through a short path. In addition, the internal part of the outlet port 6 has a curved shape so the gas smoothly flows at the curve.

The lateral flow atomic layer deposition device according to the exemplary embodiment of the present invention eliminates the gas flow control plate used in the conventional lateral flow atomic layer deposition device and changed the shapes of the gas input part and the gas output part in the reactor cover to make the gas flow path to the center of the substrate shorter than the gas flow path to the edge of the substrate and thereby increase the amount of gas per unit area supplied to the center of the substrate. Therefore, a film thickness reduction at the center of the substrate in the conventional lateral flow reactor can be prevented.

Further, the lateral flow atomic layer deposition device according to the exemplary embodiment of the present invention integrally forms the gas inlet unit and the gas outlet in one body, supplies the process gas to one side of the reactor, and outputs the same through another side thereof such that the gas flow path is simplified. Therefore, recombination and decomposition of the gas can be minimized and the switching time of gases is reduced to reduce time for depositing film.

The lateral flow atomic layer deposition device according to the exemplary embodiment of the present invention can supply the gas in various ways by changing the shapes of the inlet port and the outlet port of the gas inlet unit and the gas outlet, respectively.

Figure 3A:
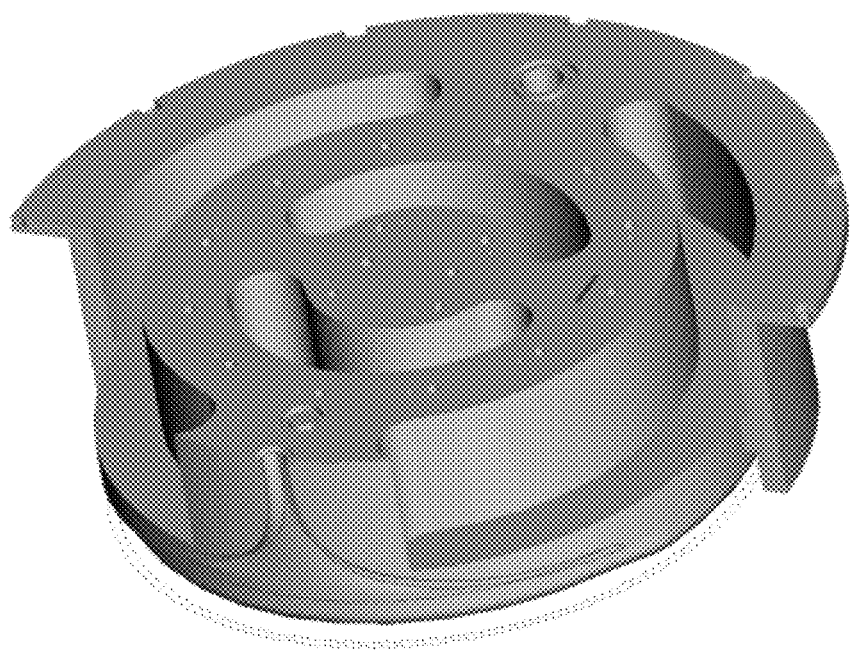
FIG. 3A shows a perspective view of a part of a top of a gas inlet unit of an atomic layer deposition device according to an exemplary embodiment of the present invention.

A one-body reactor cover having a gas inlet and a gas outlet of a lateral flow atomic layer deposition device according to an exemplary embodiment of the present invention will now be described with reference to FIG. 3A to FIG. 3C. FIG. 3A shows a perspective view of a part of a top of a gas inlet unit of an atomic layer deposition device according to an exemplary embodiment of the present invention, FIG. 3B shows a perspective view of a part of a top of a gas outlet unit of an atomic layer deposition device according to an exemplary embodiment of the present invention, and FIG. 3C shows a perspective view of a part of a top of a one-body reactor cover of an atomic layer deposition device according to an exemplary embodiment of the present invention.

Figure 3B:
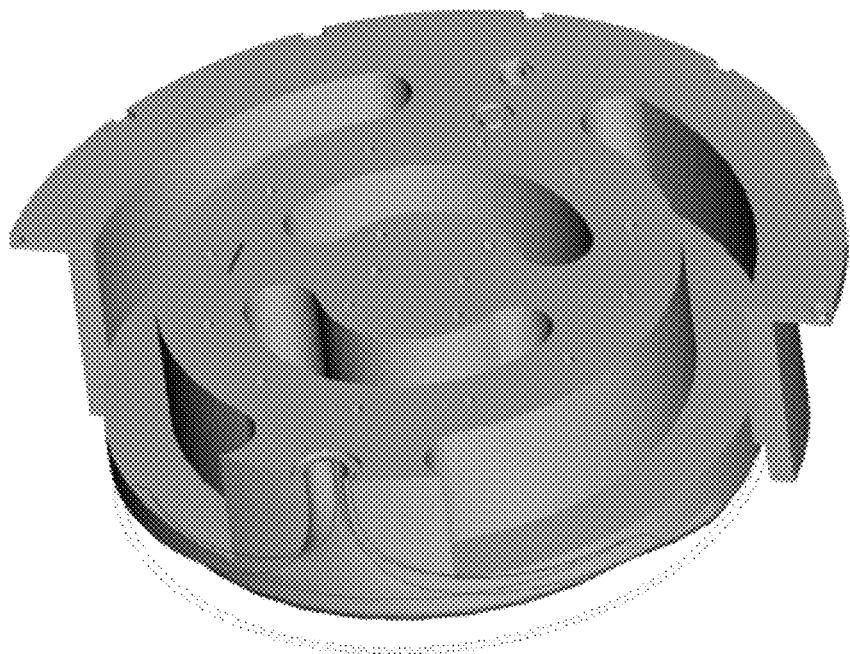
FIG. 3B shows a perspective view of a part of a top of a gas outlet unit of an atomic layer deposition device according to an exemplary embodiment of the present invention.
Figure 3C:
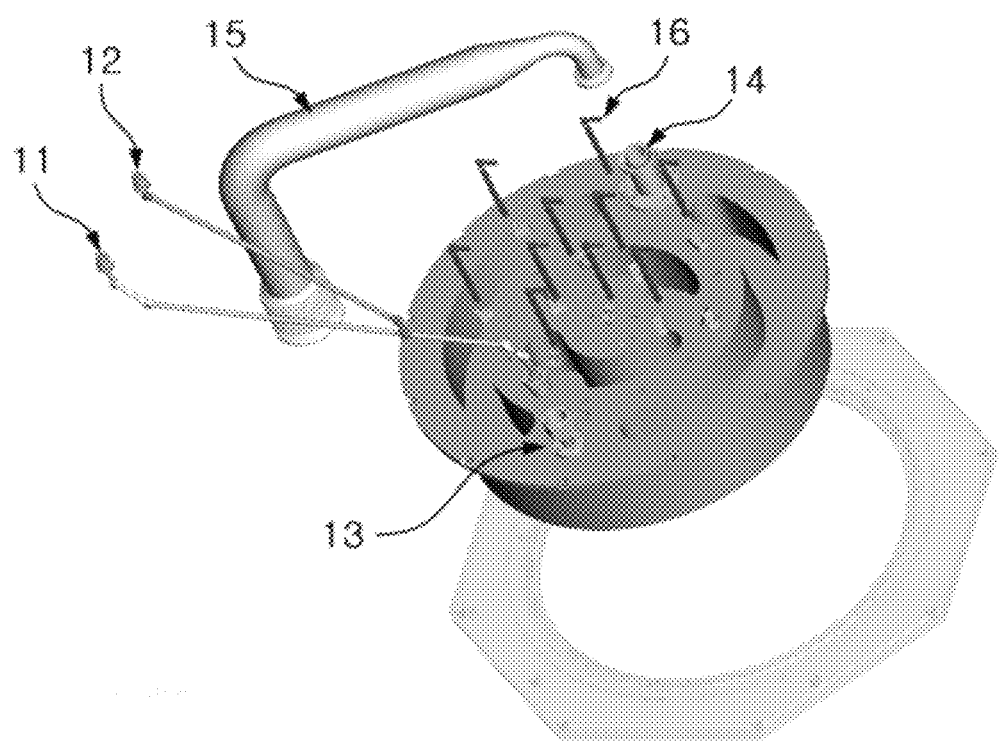
FIG. 3C shows a perspective view of a part of a top of a one-body reactor cover of an atomic layer deposition device according to an exemplary embodiment of the present invention.

Referring to FIG. 3A to FIG. 3C, gas supplied through gas inlets 11 and 12 flows to an inlet port 13 formed in the one-body reactor cover, is then supplied into the reactor, flows out through an outlet port 14 formed in the one-body reactor cover, and is then discharged to the outside through a gas outlet 15. The lateral flow atomic layer deposition device according to the exemplary embodiment of the present invention includes a plurality of temperature sensors 16 for checking temperatures of respective parts of the reactor cover. The reactor cover according to the exemplary embodiment of the present invention includes a top wall, a bottom wall, and a side wall, and a gas inlet channel and a gas outlet channel are formed on opposite sides to face each other on the side wall that surrounds at least a part of the top wall.

Figure 4A:
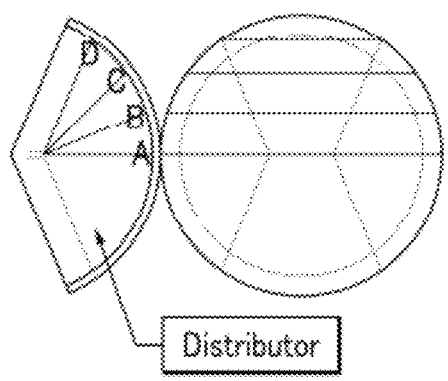
FIG. 4A and FIG. 4B show a gas path according to an experimental example of the present invention.
Figure 4B:
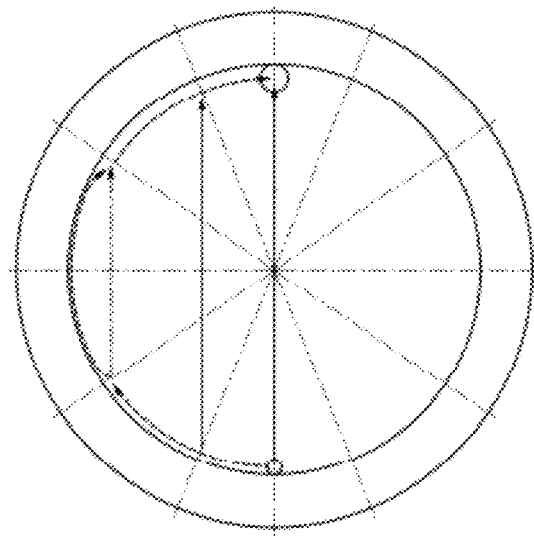
Figure 5A:
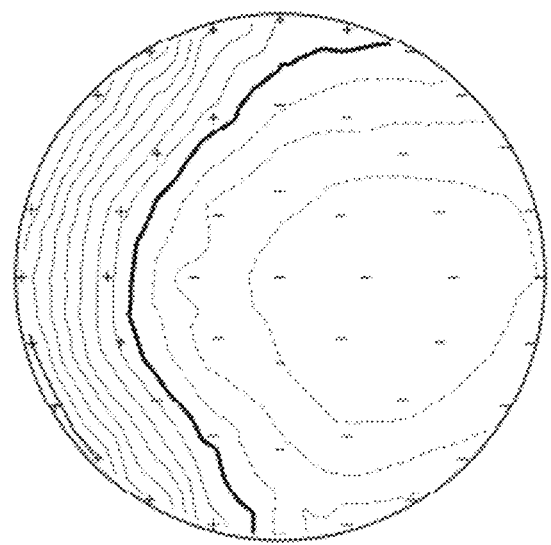
FIG. 5A and FIG. 5B show a results of film deposition according to an experimental example of the present invention.
Figure 5B:
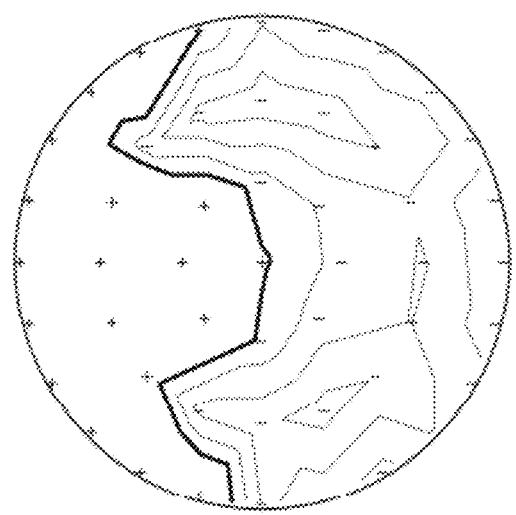

A result of an experimental example of the present invention will now be described with reference to FIG. 4A, FIG. 4B, FIG. 5A, and FIG. 5B. FIG. 4A and FIG. 4B show a gas flow path according to an experimental example of the present invention, and FIG. 5A and FIG. 5B show film deposition results according to an experimental example of the present invention.

FIG. 4A shows length of each path from a gas inlet channel to a gas outlet channel in the lateral flow atomic layer deposition device with a conventional gas flow control plate. Referring to FIG. 4A, the gas passing through the center (A) of the gas flow control plate moves the longest distance (624 mm) and the gas passing through the edge (D) moves the shortest distance (515.2 mm). Therefore, the amount of gas per unit area passing through the center area during the same process time is the least, and the thin film thickness at the center is reduced.

FIG. 4B shows comparison results of distance of each gas path from a gas inlet unit to a gas outlet unit of the lateral flow atomic layer deposition device according to an exemplary embodiment of the present invention with respect to a center and an edge, showing that the distance at the center of the substrate is substantially shorter by 100 mm than that via the edge.

Therefore, in the lateral flow atomic layer deposition device according to the exemplary embodiment of the present invention, the amount of gas per unit area passing through the center area during the same process time is increased compared to that passing through the edge area, so the film thickness reduction in the center of the substrate is prevented.

FIG. 5A and FIG. 5B show deposition results of thin films by using a lateral flow atomic layer deposition device including a conventional gas flow control plate and a lateral flow atomic layer deposition device according to an exemplary embodiment of the present invention, respectively. In detail, FIG. 5A shows a thickness distribution of a thin film that is deposited by using a lateral flow atomic layer deposition device with a conventional gas flow control plate, and FIG. 5B shows a thickness distribution of a thin film that is deposited by using a lateral flow atomic layer deposition device according to an exemplary embodiment of the present invention. In the experimental example, a zirconium oxide ($ZrO_2$) film is deposited, and experimental conditions other than the configuration of the lateral flow atomic layer deposition device are the same.

Referring to FIG. 5A, the thin film that is deposited by using the lateral flow atomic layer deposition device with the conventional gas flow control plate has a relatively smaller thickness at the center. Also, referring to FIG. 5B, the thickness at the center of the substrate is substantially improved compared to FIG. 5A.

The atomic layer deposition device according to the exemplary embodiment of the present invention prevents reduction of the film thickness at the center of the substrate by controlling the length of the gas flow path by introducing the gas inlet port and the gas outlet port that are integrally formed in the reactor cover.

Further, the lateral flow atomic layer deposition device according to the exemplary embodiment of the present invention eliminates the conventional gas flow control plate and simplifies the gas supply structure and the gas flow path to reduce recombination and decomposition of gases flowing along the gas path, and reduces the switching time of gases to reduce the process time, contributing to higher productivity.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A lateral flow atomic layer deposition device in which gases flow substantially in parallel with a substrate in a reaction space formed between a substrate and an opposite side facing the substrate, comprising:
   a reactor cover for defining a reaction space together with a substrate supporting plate for supporting the substrate;
   a gas inlet unit penetrating the reactor cover and having an internal shape that becomes progressively wider when approaching the substrate supporting plate in a vertical direction with respect to a top surface of the substrate supporting plate;
   a gas outlet unit penetrating the reactor cover, and having an internal shape that becomes progressively wider when approaching the substrate supporting plate in a vertical direction with respect to a top surface of the substrate supporting plate;
   a gas inlet connected to the gas inlet unit; and
   a gas outlet connected to the gas outlet unit,
   wherein a horizontal cross-section of the gas inlet unit at an uppermost portion has a shape of a circle, a horizontal cross-section of the gas inlet unit at a lowermost portion has a shape of an arc band, and horizontal cross-sections of the gas inlet unit between the uppermost portion and the lowermost portion are gradually changed from the circle to the arc band,
   wherein a horizontal cross-section of the gas outlet unit at an uppermost portion has a shape of a circle, a horizontal cross-section of the gas outlet unit at a lowermost portion has a shape of an arc band, and horizontal cross-sections of the gas outlet unit between the uppermost portion and the lowermost portion are gradually changed from the circle to the arc band.

2. The atomic layer deposition device of claim 1, wherein the reactor cover includes a top wall, a bottom wall, and a side wall,
the side wall surrounds at least a part of the side of the top wall, and
the gas inlet unit and the gas outlet unit are formed to face each other on the side of the top wall.

3. The atomic layer deposition device of claim 1, wherein the gas inlet includes a plurality of inlets.

4. The atomic layer deposition device of claim 1, wherein the lowermost portion of the gas inlet unit and the lowermost portion of the the gas outlet unit are disposed to face the substrate, and the horizontal cross-section of the gas inlet unit at the lowermost portion and the horizontal cross-section of the gas outlet unit at the lowermost portion are arced along an edge of the substrate.

5. The atomic layer deposition device of claim 4, wherein a gas flow path at a center of the gas inlet unit is shorter than a gas flow path at a side of the gas inlet unit.

6. A lateral flow atomic layer deposition device in which gases flow substantially in parallel with a substrate in a reaction space formed between a substrate and an opposite side facing the substrate, comprising:
   a reactor cover for defining a reaction space together with a substrate supporting plate for supporting the substrate;
   a gas inlet unit disposed on one side of the reaction space and having an internal shape of which horizontal cross-section becomes progressively longer when approaching the substrate supporting plate in a vertical direction with respect to a top surface of the substrate supporting plate;
   a gas outlet unit disposed on another side of the reaction space facing the one side of the reaction space;
   a gas inlet connected to the gas inlet unit; and
   a gas outlet connected to the gas outlet unit,
   wherein a horizontal cross-section of the gas inlet unit at an uppermost portion has a shape of a circle, a horizontal cross-section of the gas inlet unit at a lowermost portion has a shape of an arc band, and horizontal cross-sections of the gas inlet unit between the uppermost portion and the lowermost portion are gradually changed from the circle to the arc band.

7. The atomic layer deposition device of claim 6, wherein the gas outlet unit has an internal shape of which horizontal cross-section becomes progressively longer when approaching the substrate supporting plate in a vertical direction with respect to a top surface of the substrate supporting plate, and
wherein a horizontal cross-section of the gas outlet unit at an uppermost portion has a shape of a circle, a horizontal cross-section of the gas outlet unit at a lowermost portion has a shape of an arc band, and horizontal cross-sections of the gas outlet unit between the uppermost portion and the lowermost portion are gradually changed from the circle to the arc band.

8. The atomic layer deposition device of claim 7, wherein the gas inlet unit and the gas outlet unit are formed in the reactor cover.

9. The atomic layer deposition device of claim 8, wherein the reactor cover includes a top wall, a bottom wall, and a side wall,
the side wall surrounds at least a part of the side of the top wall, and the gas inlet unit and the gas outlet unit are formed to face each other on the side of the top wall.

* * * * *